United States Patent [19]
Sung et al.

[11] Patent Number: 5,631,179
[45] Date of Patent: May 20, 1997

[54] METHOD OF MANUFACTURING METALLIC SOURCE LINE, SELF-ALIGNED CONTACT FOR FLASH MEMORY DEVICES

[75] Inventors: Hung-Cheng Sung, Kaohsiung, Taiwan; Ling Chen, Sunnyvale, Calif.

[73] Assignee: Taiwan Semiconductor Manufacturing Company, Hsinchu, Taiwan

[21] Appl. No.: 511,062

[22] Filed: Aug. 3, 1995

[51] Int. Cl.⁶ .................................... H01L 21/8247
[52] U.S. Cl. .......................... 438/264; 438/586; 438/790
[58] Field of Search ................................ 437/43, 44, 48, 437/49, 192, 984

[56] References Cited

U.S. PATENT DOCUMENTS

| | | | |
|---|---|---|---|
| 5,204,286 | 4/1993 | Doan | 437/195 |
| 5,231,051 | 7/1993 | Baldi et al. | 437/187 |
| 5,366,913 | 11/1994 | Nakao | 437/48 |
| 5,397,723 | 3/1995 | Shirota et al. | 437/43 |
| 5,432,110 | 7/1995 | Inoue | 437/984 |

*Primary Examiner*—Chandra Chaudhari
*Attorney, Agent, or Firm*—George O. Saile; Graham S. Jones, II

[57] ABSTRACT

Manufacture of an integrated circuit flash memory devices includes covering a semiconductor substrate with a tunnel oxide layer, a floating gate layer, an intergate dielectric layer, a control gate layer, a silicon dioxide dielectric layer over a silicon nitride layer. Then those layers over the tunnel oxide are patterned into flash memory gate electrode by etching through a source/drain mask followed by ion implanting source/drain dopant ions through the openings formed by etching. Sidewall spacers are formed followed by a dielectric layer through which source line openings are etched down to the source/drain regions. Plug openings are made down to the source/drain regions. An intermetal dielectric layer is deposited comprising PEOX/SOG/PEOX over the device. Then via openings are made over the drain plugs by etching the intermetal dielectric layer through a via mask. Next metal is deposited over the intermetal dielectric layer into the via openings extending down into contact with the drain plugs.

21 Claims, 9 Drawing Sheets

METHOD OF MANUFACTURING METALLIC SOURCE LINE, SELF-ALIGNED CONTACT FOR FLASH MEMORY DEVICES

BACKGROUND OF THE INVENTION

1. Field of the Invention

This invention relates to a method of manufacture of semiconductor memory devices and more particularly manufacture of electrical connection to bit lines in memory devices and the devices manufacturee thereby.

2. Description of Related Art

U.S. Pat. No. 5,204,286 of Doan for "Method of Making Self-Aligned Contacts and Vertical Interconnects to Integrated Circuits" and U.S. Pat. No. 5,231,051 of Baldi et al for "Method for Formation of Contact Plugs Utilizing Etchback" show use of deposits of tungsten which are etched back to form contacts.

In a conventional EPROM (Flash memory) layout, the source line is a diffusion type which must connect to a metal pick-up for about 16 cells. In addition, the drain contact to the poly is not self-aligned. Both of these factors limit the ability to reduce the scale (dimensions) of EPROM (Flash) memory devices.

SUMMARY OF THE INVENTION

By using a design in accordance with this invention, the number of source pickups can be reduced to a very substantial degree.

In addition, the polysilicon to contact space can be zero. The area saved can be about 20%, and the source resistance decreases. As a result the performance of memory devices is improved substantially.

In accordance with this invention, a method is provided for manufacturing integrated circuit flash memory devices. The memory devices include metallic source lines and self-aligned contacts. The semiconductor substrate has devices therein to which electrical connections must be made.

First, form a tunnel oxide layer on the substrate. Then form a blanket, doped, floating gate, polysilicon layer over the tunnel oxide layer on the substrate, followed by forming an intergate dielectric layer over the blanket, polysilicon layer which has been doped. Then form a blanket control gate electrode, polycide layer over the intergate dielectric layer. Form a silicon dioxide dielectric layer over the blanket polycide layer. The silicon dioxide layer comprises a TEOS (tetraethylorthosilicate) dielectric layer at a temperature between about 650° and 750° C. in an LPCVD reactor by decomposing tetraethoxysilane, $Si(OC_2H_5)_4$ vaporized from a liquid source producing a complex mixture of organic and organosilicon compounds above the second, blanket polysilicon layer. Next, form a silicon nitride ($Si_3N_4$) layer over the silicon dioxide layer. Form a source/drain mask over the silicon nitride layer with source/drain openings therein. Etch to form an array of stacks of the silicon nitride ($Si_3N_4$) layer, the silicon dioxide dielectric layer, polycide layer, the intergate dielectric layer, and the polysilicon layer down to the tunnel oxide layer, the stacks having sidewalls with trench spaces therebetween. Ion implant source/drain dopant ions with an MDD ion implanting process between the stacks Form alternating source regions and drain regions below the trench spaces between the sidewalls. Then, form spacer dielectric structures adjacent to the sidewalls. Form a blanket dielectric layer over the stacks, the trench spaces and the sidewalls, the blanket dielectric layer comprising BPTEOS. Etch source line openings down to the source regions and etching drain plug openings down to the drain regions through the blanket dielectric layer down to the source regions and the drain regions. Form a conductive metal blanket layer over the device extending down into contact with the source regions through the source line openings and down into contact with the drain regions through the drain plug openings.

Etch back the conductive metal layer leaving drain plugs and source lines, with the drain plugs located over the drain regions comprising conductive metal in the plug openings between the stacks. The source lines are over the source regions comprising conductive metal in the source line openings between the stacks and the spacers.

Then deposit an intermetal dielectric layer over the device including the drain plugs and the source lines. The intermetal dielectric layer comprises a PEOX/SOG/PEOX dielectric formed with a first PEOX layer with a thickness between about 2,000 Å and about 3,000 Å. a SOG layer with a thickness between about 3,000 Å and about 4,000 Å and a second PEOX layer with a thickness between about 5,000 Å and about 6,000 Å.

Form a via mask with via openings over the drain plugs upon the intermetal dielectric layer. Etch through the via openings in the via mask through the intermetal dielectric layer forming openings therethrough to the drain plugs. Strip the via mask. Then deposit metal over the intermetal dielectric layer into the via openings extending down into contact with the drain plugs.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

By using a design in accordance with this invention, the number of source pickups can be reduced to a very substantial degree. Another advantage is that the polysilicon to contact space can be zero. The area saved can be about 20%. Moreover, the source resistance decreases. Thus, the performance of memory devices can be considerably enhanced.

Figure 1A:
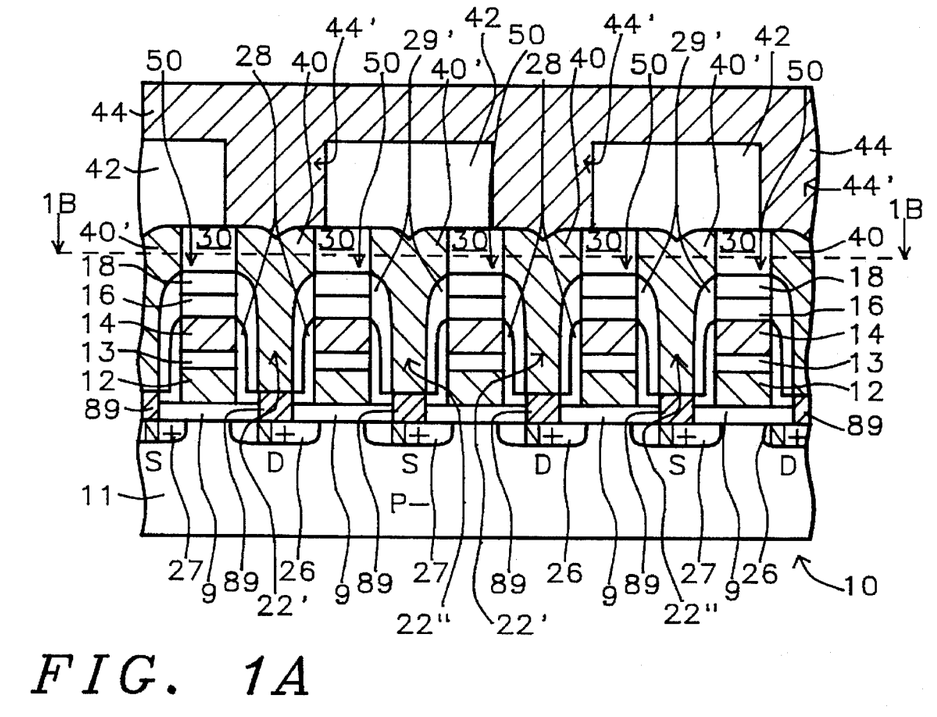
FIG. 1A shows a flash memory device sectional view of a flash memory device 10 taken along line 1A—1A in FIG. 1B. The flash memory device shown in FIG. 1A incorporates the features of this invention and is made in accordance with the method of this invention.
Figure 1B:
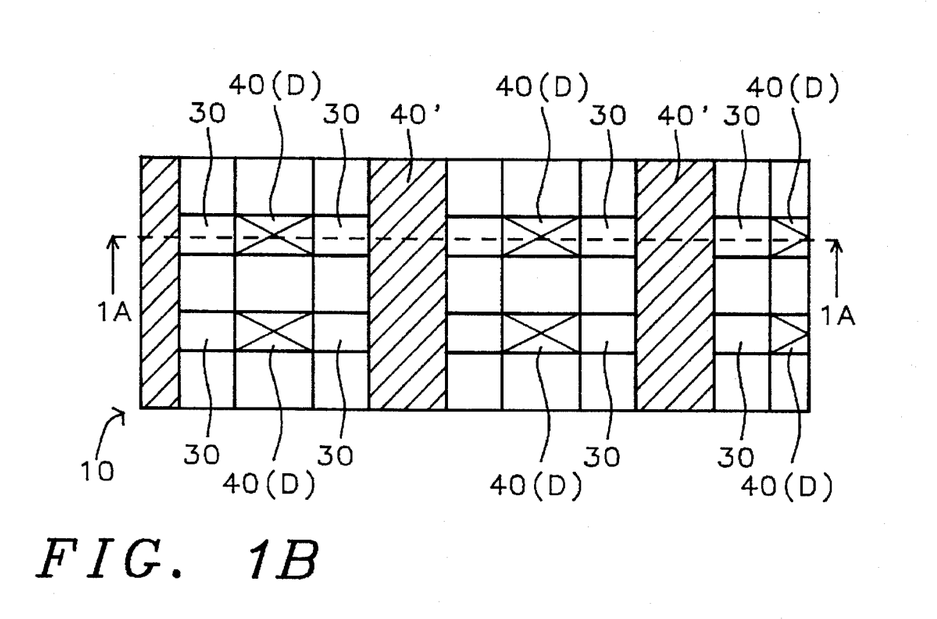
FIG. 1B is a sectional view of the device of FIG. 1A taken along line 1B—1B in FIG. 1A.

FIG. 1A shows a sectional view of a flash memory device 10 taken along line 1A—1A in FIG. 1B. FIG. 1B is a sectional view of the device of FIG. 1A taken along line 1B—1B in FIG. 1A. The flash memory device device 10 is formed on a P- lightly doped silicon semiconductor substrate 11 upon which a tunnel oxide layer 9 comprising an oxide of silicon has been formed having a thickness of between about 80 Å and 120 Å. Over tunnel oxide layer 9 are formed stacks 50 of floating gate electrodes 12, an ONO intergate dielectric layer 13, control gate electrodes 14, and two additional dielectric layers including TEOS glass layer 16 and silicon nitride ($Si_3N_4$) dielectric layer 18. The stacks 50 have sidewalls on the edges of floating gate electrodes 12, ONO layer 13, control gate electrodes 14, TEOS glass layer 16 and silicon nitride ($Si_3N_4$) layer 18.

The floating gate electrodes 12 are composed of doped polysilicon, formed from a control gates layer 12. Preferably, the floating gate electrode has a thickness between about 1,300 Å and about 1,500 Å. Above floating gate electrodes 12, a conventional ONO intergate dielectric layer 13 has been deposited with a thickness between about 250 Å and about 300 Å. Formed above ONO dielectric layer 13, are control gate electrodes 14 composed of a second doped polysilicon layer. Control gate electrodes 14 preferably have a thickness between about 3,000 Å and about 4,000 Å.

Above the control gate electrodes 14 is formed a silicon dioxide TEOS (tetraethylorthosilicate) dielectric layer 16, with a thickness between about 1,500 Å and about 2,000 Å. In turn, above dielectric layer 16, a silicon nitride ($Si_3N_4$) dielectric layer 18 is formed with a thickness between about 500 Å and about 800 Å. Layer 18 completes stacks 50 of gate electrodes 12 and 14, ONO layer 13, dielectric layer 16 topped off by the dielectric layer 18. Stacks 50 are separated by trench spaces 22' and 22" which are of substantially equal widths.

Between the stacks 50, in the silicon semiconductor substrate 11 are formed doped drain regions 26 located below trench spaces 22' and source regions 27 located below trench spaces 22". Drain regions 26 and source regions 27 are MDD ion implanted regions with a concentration of implanted atoms between about $1 \times 10^{15}$ atoms/cm$^3$ and about $5 \times 10^5$ atoms/cm$^3$ to form MDD Junction of source regions 27 and drain regions 26 in substrate 11.

There are oxidized sidewalls 28 in trench spaces 22' and 22" formed on the sidewalls of the stacks 50 covering the edge surfaces of gate electrodes 12 and 14, and ONO layer 13. The oxidized sidewalls 28 are formed with a thickness between about 100 Å and about 200 Å.

On the sidewalls 28 and on the sidewall edges of dielectric layer 16 and dielectric layer 18 are formed silicon nitride ($Si_3N_4$) spacers 29' with a thickness between about 1,500 Å and about 2,000 Å. The N+ implant is done after spacer formation to form source and drain junction.

Above the stacks 50 are formed planarized BPTEOS, interlayer dielectric (ILD), regions 30 with a thickness between about 3,000 Å and about 4,000 Å.

Tungsten plugs 40 and source lines 40' are formed above the drain regions 26 and the source regions 27, between the BPTEOS regions 30 and between the stacks 50 of floating gates 12, ONO layer 13 and control gates 14, completely filling the space between the sidewalls 29' above the drain and source regions 26 and 27.

Tungsten drain plugs 40 and source lines 40' reach down between spacers 29' into contact with the drain regions 26 and source regions 27.

An intermetal dielectric (IMD) layer 42 with a thickness between about 10,000 Å and about 12,000 Å has been formed over the drain plugs 40 and source lines 40' with openings down to the drain plugs 40 over the drain regions 26, but covering the source lines 40' over the source regions 27.

The metal bit-line material 44 with a thickness between about 7,000 Å and about 8,000 Å has been deposited as a blanket layer over intermetal dielectric layer 42, and then etched to provide the metal bit-lines 44 in accordance with the two parallel bit-line patterns seen in FIG. 1B, as well as the vias 44' which extend down into contact only with the drain plugs 40 which connect to the drain regions 26, since the dielectric regions 42 serving as an electrical insulator separates the bit-lines 44 from the source lines 40'.

In FIG. 1B, the location of the contacts with drain regions 26 below is indicated by X markings. The source lines 40' over the source regions extend from front to back. The contact the drains 26 covering the tops of the source regions 27 as the bridge over the top surfaces of plugs 29" as shown in FIG. 1A.

Process

Figure 2A:
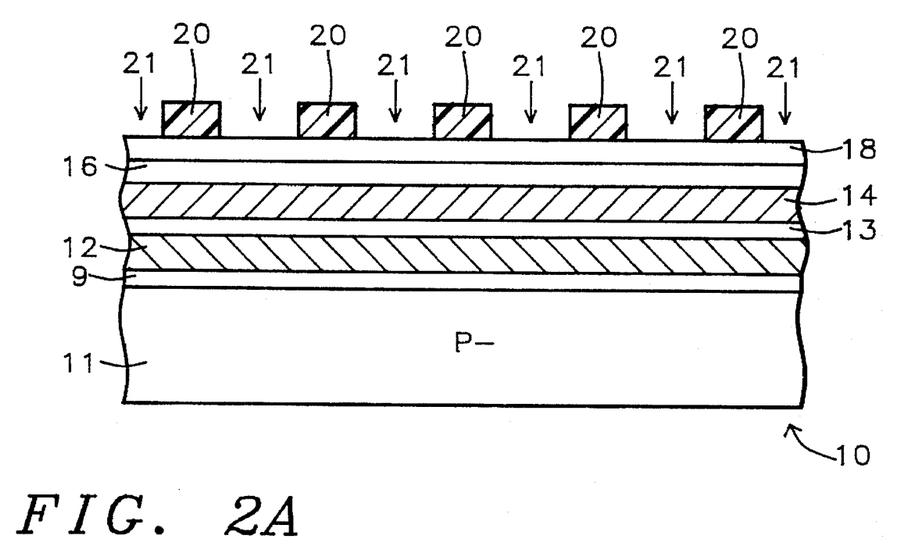
FIG. 2A–2C shows the flash memory device of FIGS. 1A and 1B in views taken along line 2C—2C in FIG. 2E illustrating the early stages of performance of the method of manufacturing in accordance with this invention.
Figure 2B:
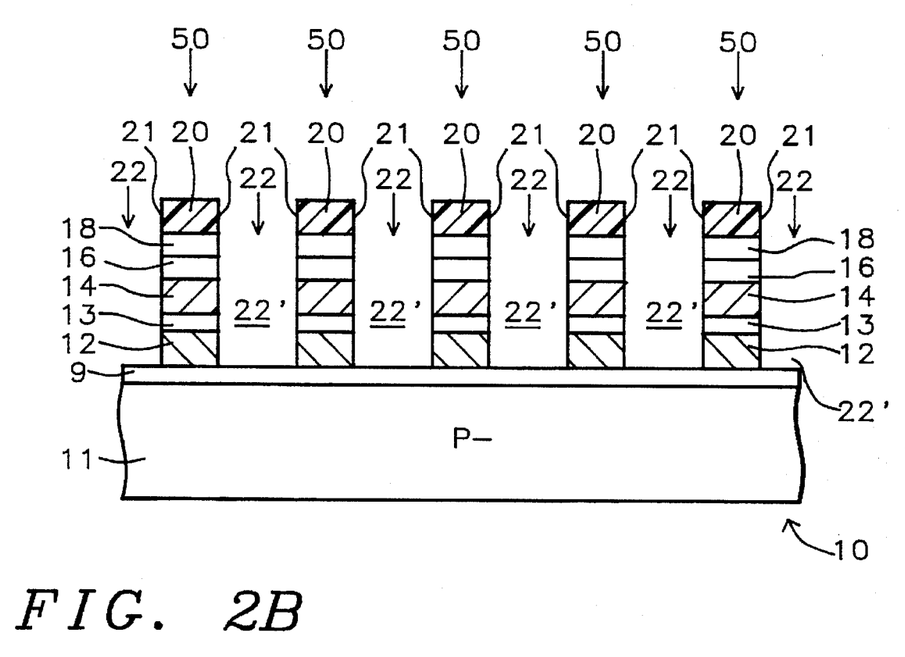
Figure 2C:
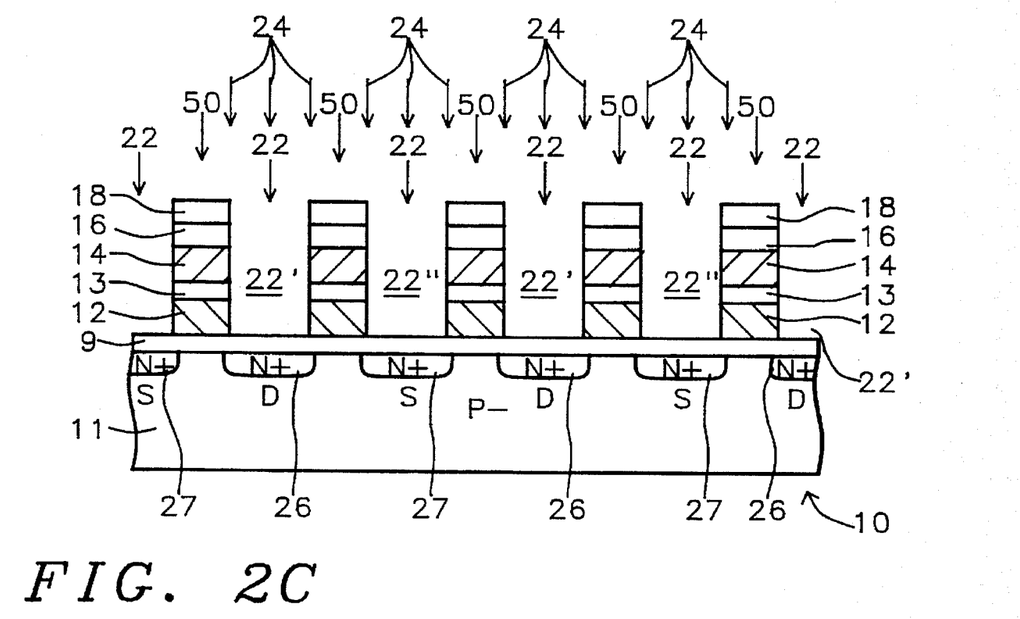

FIG. 2A-2C are a sectional views showing the early stages of of manufacturing of the completed flash memory device 10 of FIGS. 1A and 1B. FIG. 2A-2C are a sectional views taken along line 2C—2C in FIG. 2E of flash memory device 10. Referring to FIG. 2A, a partially completed flash memory device 10 is being formed on a P- lightly doped silicon semiconductor substrate 11 upon which a conventional tunnel oxide layer 9 has been formed. Tunnel oxide layer 9 comprises a thin oxide of silicon having a thickness between about 80 Å and about 120 Å.

Then a floating gate layer 12 composed of a blanket deposit of doped polysilicon (P1) layer is formed over tunnel oxide layer 9. Above floating gate layer 12, a conventional ONO (intergate) dielectric layer 13 is deposited. Next, a blanket control gate layer 14, preferably composed of polycide (P2) is formed upon ONO dielectric layer 13.

The floating gate layer 12 comprises a heavily doped layer of polysilicon formed by either thermal reduction of $SiHCl_3$ (or dichlorosilane $SiH_2Cl_2$) in hydrogen or by thermal decomposition of silane $SiH_4$ in a reactor between about 600° C. and 650° C. at 0.2 to 1.0 Torr using 100% silane or a diluted mixture of 20-30% silane in nitrogen at about the same pressure.

The control gates layer 14 is formed of a conventional polycide (P2) layer material which preferably comprises tungsten silicide with a thickness between about 1,000 Å and about 2,000 Å, which is formed over a base of polysilicon with a thickness between about 1,000 Å and about 2,000 Å.

Then above control gates layer 14, a silicon dioxide TEOS (tetraethylorthosilicate) dielectric layer 16 has been deposited between about 650° and 750° C. in an LPCVD reactor by decomposing tetraethoxysilane, $Si(OC_2H_5)_4$ vaporized from a liquid source producing a complex mixture of organic and organosilicon compounds LPCVD with a gas mixture of $SiH_2Cl_2/NH_3$, 0.3 Torr within a temperature range between about 800° C. and about 850° C.

Subsequently, a silicon nitride ($Si_3N_4$) layer 18 is deposited in a blanket layer over the TEOS glass layer 16.

Above the silicon nitride ($Si_3N_4$) layer 18, a source/drain photoresist mask 20 has been formed with equally spaced source/drain openings 21 therein above the regions below where drain regions 26 and source regions 27 are formed in the flash memory device 10, as shown in FIG. 1A.

FIG. 2B shows the device of FIG. 2A after etching of openings 22 forming trench spaces 22' over drain regions 26 and trench spaces 22" over source regions 27 extending down through the layers 18, 16, 14, 13 and 12 to the surface of substrate 11 using mask 20 to control the etching. The result of this etching is the stacks 50 of gate electrodes 12 and 14, ONO layer 13, dielectric layer 16 and dielectric layer 18 separated by trench spaces 22' and 22".

Figure 2D:
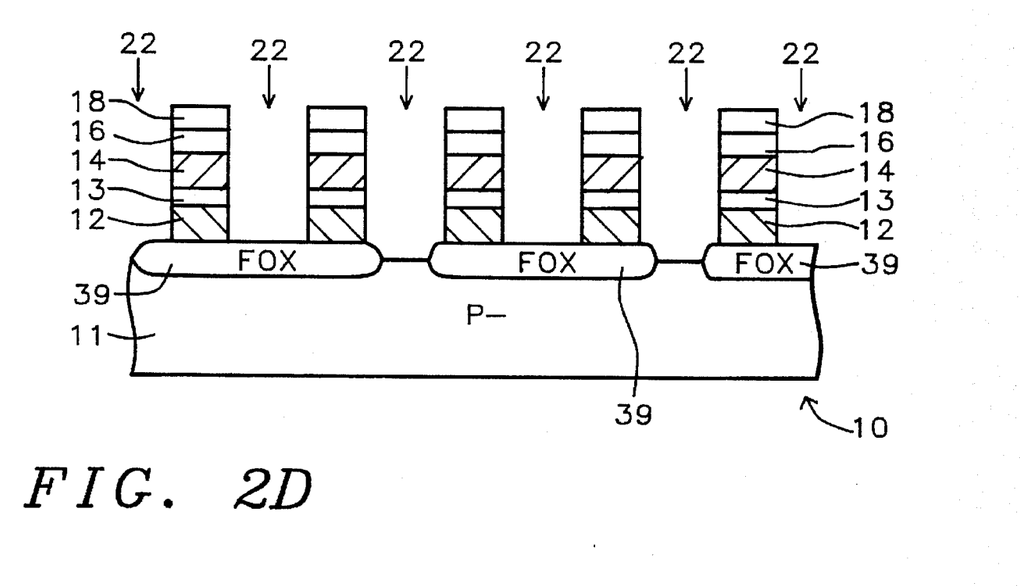
FIG. 2D is a section taken along line 2D—2D in FIG. 2E.
Figure 2E:
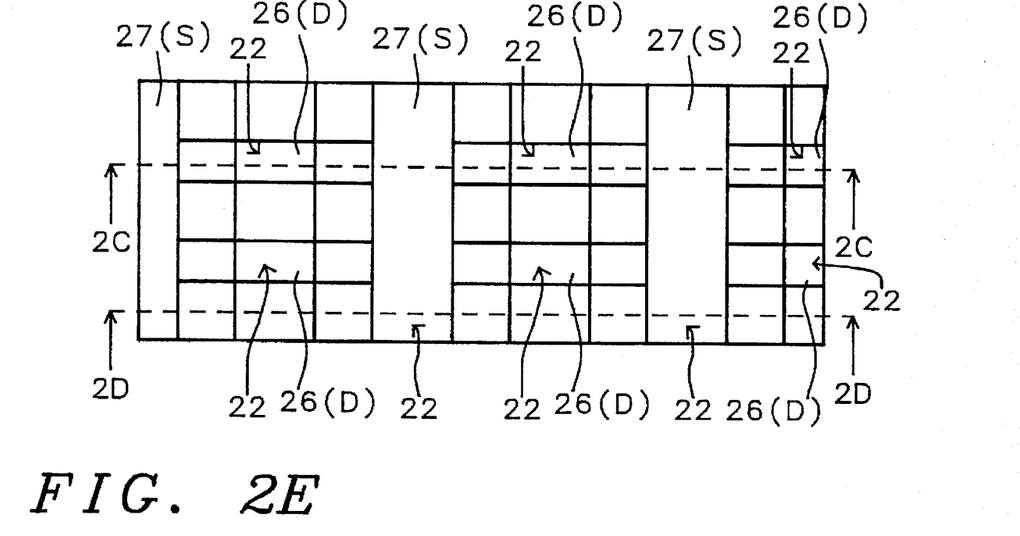
FIG. 2E is a plan view of the device of FIGS. 2C and 2D showing the trench spaces down to the surfaces of drain and source regions In the substrate.

FIG. 2C is a sectional view taken along line 2C—2C in FIG. 2E, which is a plan view showing the trench spaces 22' and 22" down to the surfaces of drain regions 26 and source regions 27, in the substrate 11. FIG. 2C shows the device of FIG. 2B after self-aligned ion implantation of arsenic (chemical variety) of dopant ions 24 are deposited through trench spaces 22' and 22" between stacks 50 into the drain regions 26 and source regions 27, respectively, in an MDD (Medium Doped Drain) ion implanting process with a concentration of implanted ions between about $1 \times 10^{20}$ atoms/cm$^3$ and about $1 \times 10^{21}$ atoms/cm$^3$ to form the MDD Junction of source regions 27 and drain regions 26 in substrate 11.

The ion implanted dopant 24, which is preferably arsenic (chemical species or variety of impurity) is implanted with a dose of between about $1 \times 10^{15}$ ions/cm$^2$ and about $5 \times 10^{15}$ ions/cm2. It is implanted at an energy of between about 50 keV and about 80 keV in a medium energy implanter tool.

FIG. 2D is a section taken along line 2D—2D in FIG. 2E which shows a set of field oxide (FOX) regions 39 formed over and extending partially down into the substrate 11. the stack of layers floating gates 12, ONO dielectric layer 13 control gates 14, the TEOS glass layer 16 and silicon nitride ($Si_3N_4$) layer 18 with trenches 22 therebetween.

Figure 2F:
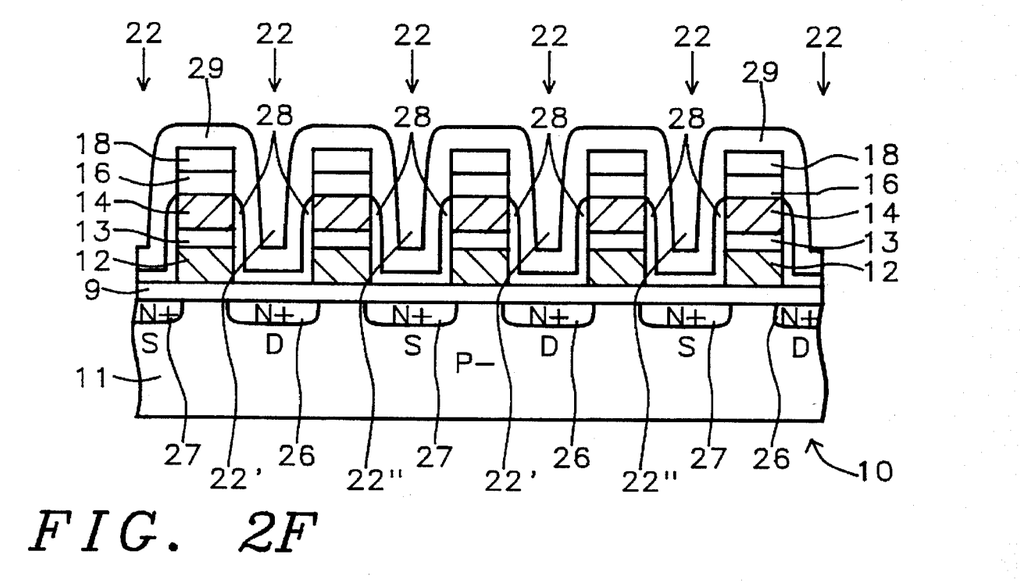
FIG. 2F is a section taken along line 2C—2C in FIG. 2E shows the device of FIG. 2C, after the formation of oxidized sidewalls within trench spaces on the exposed sidewall surfaces of floating gates layer, ONO dielectric layer, and the control gates layer.

FIG. 2F is a section taken along line 2C—2C in FIG. 2E shows the device of FIG. 2C, after the formation of oxidized sidewalls 28, within trench spaces 22' and 22" on the exposed sidewall surfaces of floating gates layer 12, ONO dielectric layer 13, and control gates layer 14. Then the oxidized sidewalls 28 are formed on the exposed edges of the gate electrodes formed from control gates layer 12, ONO dielectric layer 13, and second polysilicon layer 14. The oxidized sidewalls 28 have a thickness between about 100 Å and about 200 Å.

Later, there is formed a blanket silicon nitride ($Si_3N_4$) layer 29 over the entire flash memory device 10 including the space within trench spaces 22' and the exposed surfaces of the source regions 27 and drain regions 26 of substrate 11 and upon oxidized sidewalls 28. Next, the blanket silicon nitride ($Si_3N_4$) layer 29 is subjected to an etching process to etch back layer 29 to form silicon nitride spacers 29' (as seen in FIG. 1A and FIG. 2G) adjacent to the sidewalls of stacks 50.

Before the etch back, the blanket layer 29 originally has a thickness between about 1,500 Å and about 2,000 Å. After the etch back process, silicon nitride ($Si_3N_4$) spacers 29' have a thickness between about 1,500 Å and about 2,000 Å.

The layer 29 is etched back to form the spacers 29' by plasma etching with $SF_6$ gas at a pressure of about 400 mTorr. After the spacer etching step, there is an N+ implant of arsenic implanted at an energy of between about 40 keV and about 60 keV with a dose of between about $3 \times 10^{15}$ ions/cm$^2$ and about $5 \times 10^{15}$ ions/cm2.

Figure 2G:
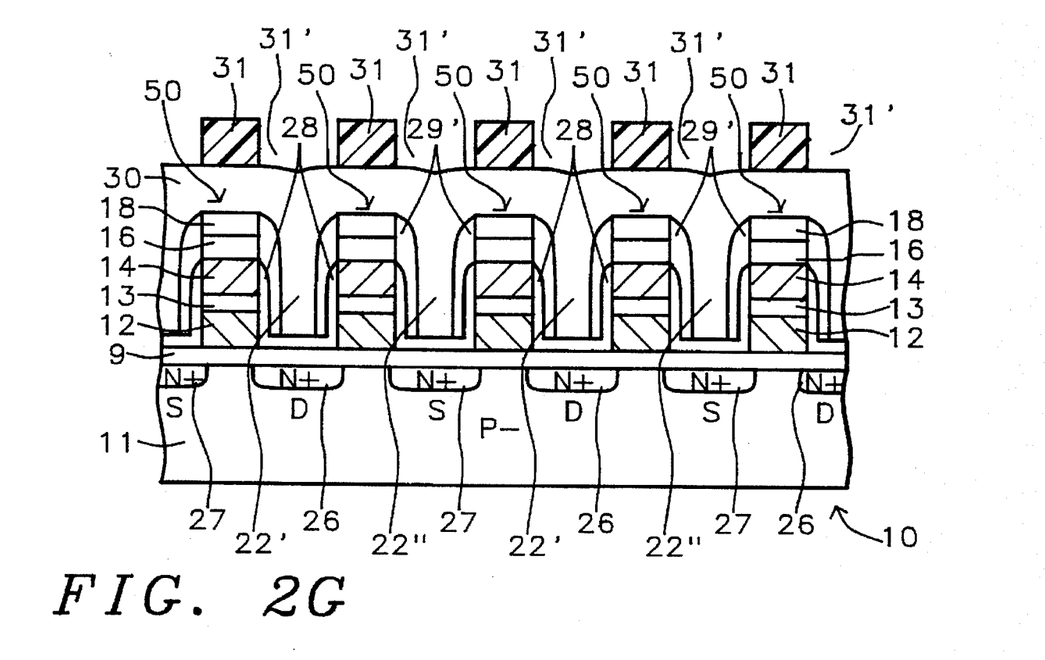
FIG. 2G is a section taken along line 2G—2G in FIG. 2H showing the device of FIG. 2F after the blanket deposition over the partially completed flash memory device of a BPTEOS dielectric layer.
Figure 2H:
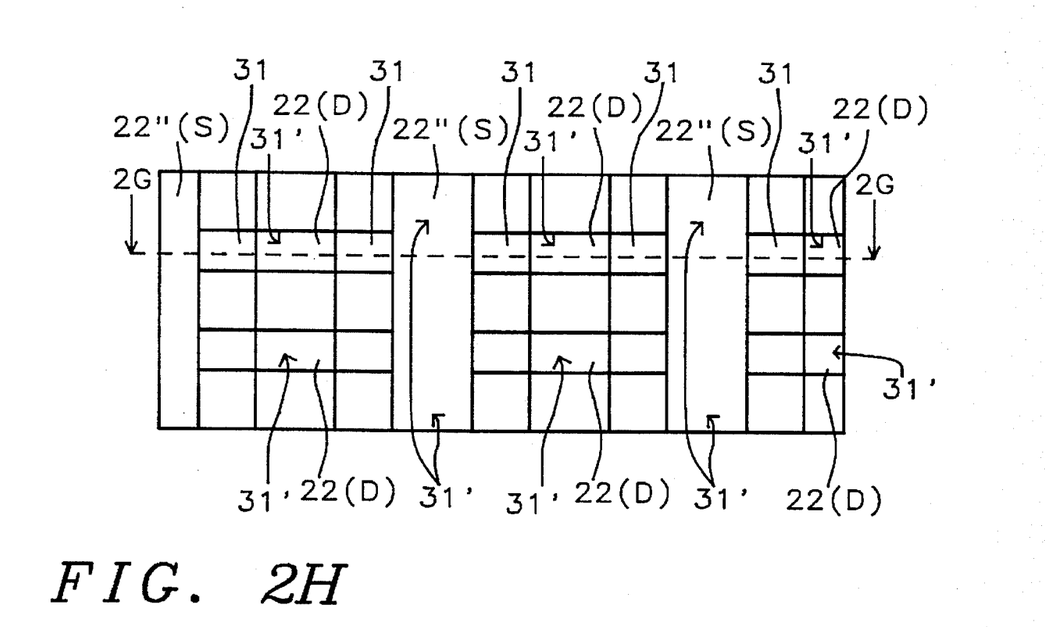
FIG. 2H is a plan view of the device of FIG. 2G showing the pattern of a mask seen in FIG. 2G.

FIG. 2G is a section taken along line 2G—2G in FIG. 2H, which shows the device 10 of FIG. 2F after the blanket deposition over the partially completed flash memory device 10 of a BPTEOS, dielectric layer 30 with a thickness between about 8,000 Å and about 11,000 Å.

The BPTEOS layer 30 is formed by depositing a glass dielectric layer of BPTEOS (composed of Boron, Phosphorus, Tetraethylorthosilicate) with a concentration of boron (B) between about 2.5 wt. % to about 5 wt. % and with a concentration of phosphorous (P) between about 3 wt. % to about 5.5 wt. %. The BPTEOS layer is formed with a CVD tool selected from APCVD, PECVD, LPCVD (Low Pressure C.V.D.) which deposits BPTEOS. The typical BPTEOS composition comprise a boron-phosphorous $SiO_2$ with boron of 4 wt. % and phosphorous of 4 wt. %.

Next, an etching process is performed to planarize the BPTEOS layer 30.

Following the planarization of the BPTEOS layer 30, a photoresist mask 31 shown in FIG. 2G (see FIG. 3A also) is formed over the partially completed flash memory device 10. Mask 31 is used in the process of making electrical contacts to drain regions 26 and simultaneously making electrical contacts to source regions 27. Openings 31' through mask 31 are formed therein over trench spaces 22' between the stacks 50.

Figure 3A:
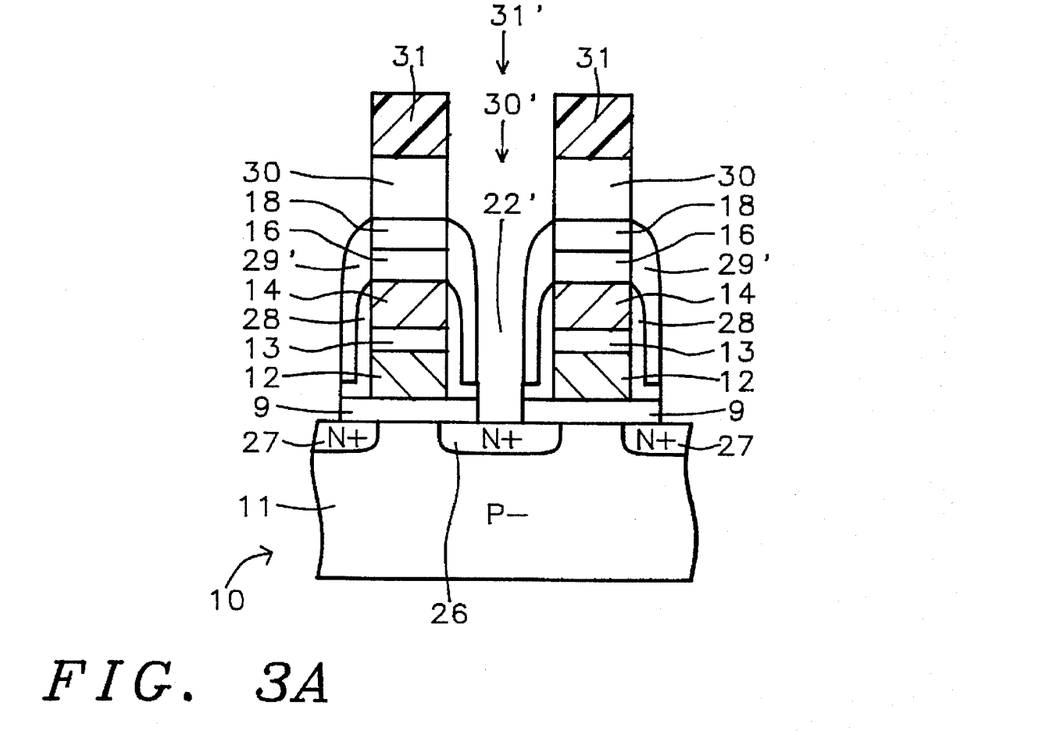
FIGS. 3A and 3B show a fragment of the partially completed flash memory device of FIGS. 2G and 2H.

FIG. 3A shows a fragment of the partially completed flash memory device 10 of FIGS. 2G and 2H after the BPTEOS layer 30 has had openings 30' etched therethrough where there are openings in the photoresist mask 31 (which is seen in FIG. 2G.) FIG. 2H shows a plan view of the device 10 of FIG. 2G with mask 31 and its openings 31'. The portions of the BPTEOS layer 30 not protected by that mask 31 have been etched down to the surface of the drain regions 26 and down to the surface of the source regions 27 through both the BPTEOS layer 30 and the exposed portions of the tunnel oxide layer 9 therebelow. The pattern of the mask 31 is seen in FIG. 2H, which is a plan view of the device 10 of FIG. 2G.

The process used to etch BPTEOS layer 30 comprises selective etching in a plasma etching machine with a gas mixture of $C_4F_8/CF_8/CO/Ar$. This machine and the recipe employed allows high selectivity of BPTEOS/$Si_3N_4$ of with a ratio of from about 18/1 to about 30/1 so that $Si_3N_4$ spacers 29' are not significantly etched. The preferred ratio is about 28/1. The preferred conditions for the process are a pressure of 100 mTorr, a power of 1,000 watts, and the gas mixture of $C_4F_8/CF_8/CO/Ar$ in a ratio of 5/10/200/600 sccm.

Figure 2I:
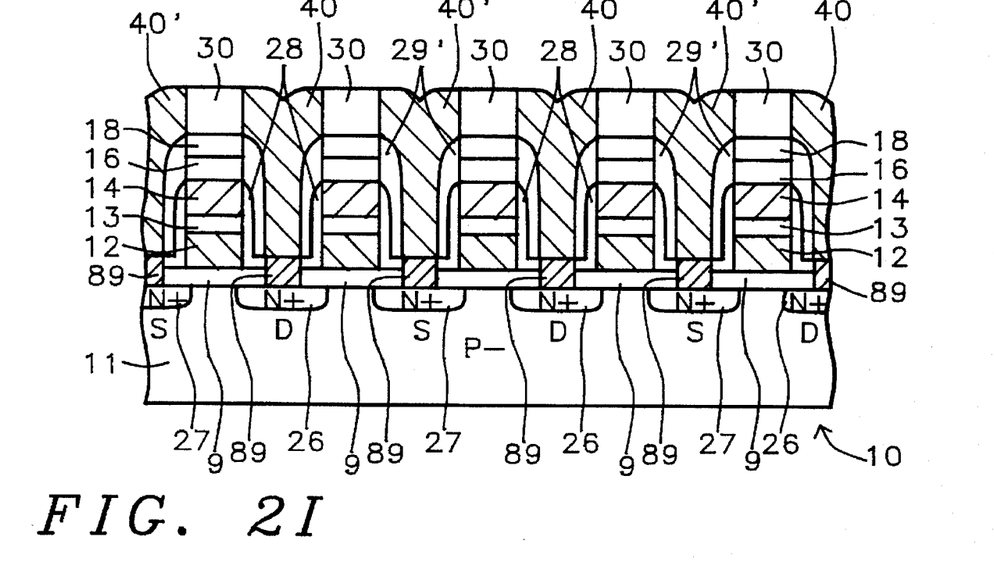
FIG. 2I shows the partially completed flash memory device of FIGS. 2G and 2H after the BPTEOS layer has been etched through a photoresist mask.
Figure 3B:
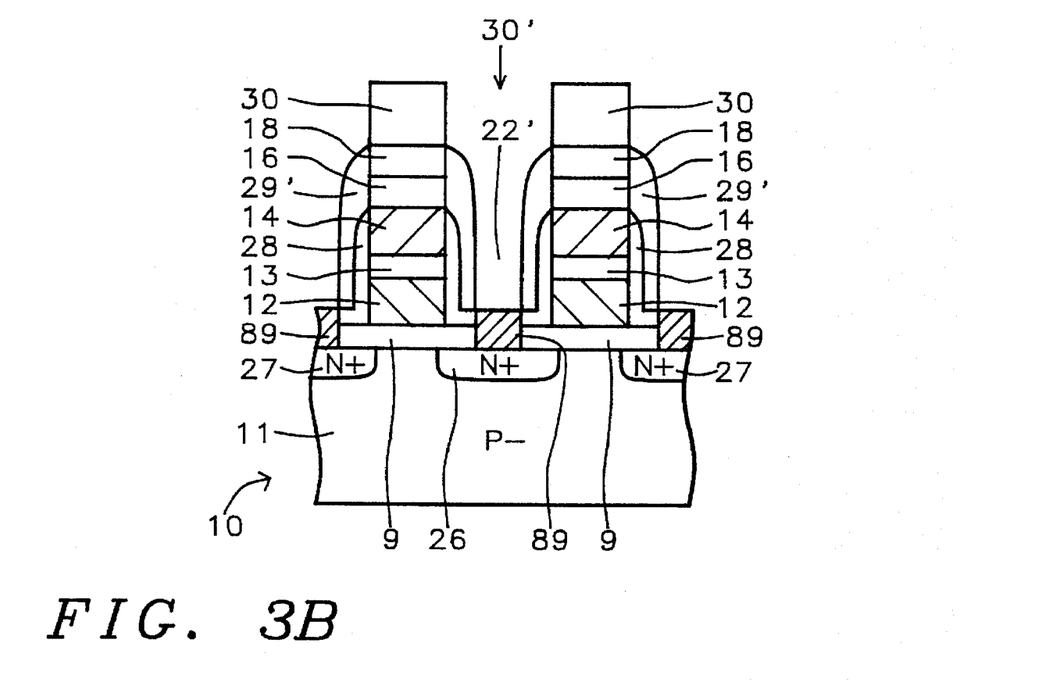

FIG. 3B shows a fragment of a partially completed flash memory device 10 of FIGS. 2G and 2H after a barrier metal layer of Ti/TiN=400 Å to 1,000 Å is deposited by sputtering on the device 10 through the openings in the layer 30 over the drain regions 26 and the source regions 27. As a result barrier metal layers 89 are formed on the exposed surfaces of the drain regions 26 and the source regions 27 in the spaces 22' seen in FIGS. 3B and 2I.

A blanket layer of tungsten metal 40 having a thickness between about 6,000 Å and about 8,000 Å is deposited upon the device 10 after etching of the BPTEOS layer 30, the removal of photoresist mask 31, and formation of the barrier metal layers 89 on the drain regions 26 and the source regions 27. The tungsten metal 40 reaches down into the openings in the BPTEOS layer 30 to contact the barrier metal layers 89 and over the spacers 29' thereby forming electrical contact from the tungsten metal 40 through the drain regions 26 and the source regions 27.

The process of deposition of tungsten metal 40 includes a nucleation step followed by a main step. Nucleation step parameters are: 4.5 Torr, 475° C., Ar/$N_2$/$SiH_4$/$WF_6$. Main step parameters are: 80 Torr, 475° C., Ar/$N_2$/$H_2$/$WF_6$.

Periphery Metal and Define/Etch

After the tungsten metal (W) etch back, AlSiCu (4,000 Å) is deposited and defined to form the first metal layer (M-1) interconnection in the peripheral circuit. In the cell region, the first metal layer (M-1) is fully etched.

By means of an etch back process, tungsten metal drain plugs 40 and source lines 40' are formed above the drain regions 26 and the source regions 27, between the BPTEOS ILD regions 30 and between the stacks 50 of floating gates 12, ONO layer 13 and control gates 14, completely filling the space between the sidewalls 29' above the drain and source regions 26 and 27.

Tungsten drain plugs 40 over the drain regions 26 and source lines 40' over the source regions 27 reach down between spacers 29' into contact with the drain regions 26 and source regions 27, respectively.

Figure 2J:
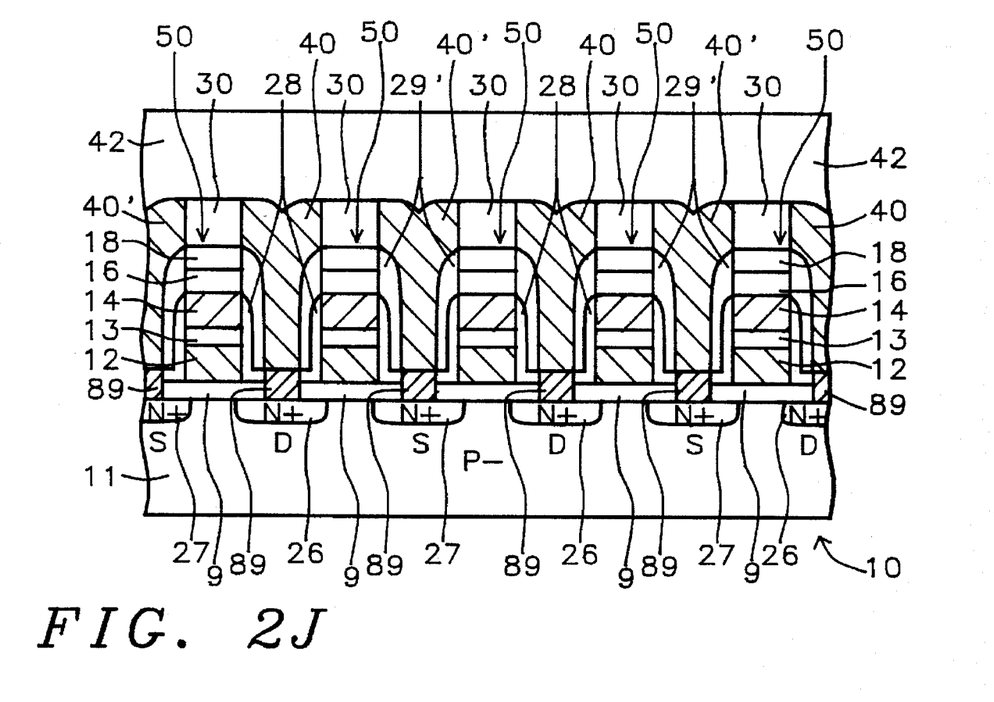
FIG. 2J shows the device of FIG. 2I after the blanket deposition of an IMD (Inter Metal Dielectric) layer.

FIG. 2J shows the device 10 of FIG. 2I after the blanket deposition of an intermetal dielectric (IMD) layer 42 has been formed over the drain plugs 40 and source lines 40' and over BPTEOS ILD (Inter Layer Dielectric) layer 42 is formed by PEOX/SOG/PEOX deposition, where PEOX= Plasma Enhanced OXide, and SOG=Spin On Glass.

The PEOX/SOG/PEOX dielectric is preferably formed by the process recipe of PEOX:gas: $SiH_4$/$N_2O$ at a Temp>300° C. and a pressure of 1 Torr. The PEOX (1) thickness is between about 2,000 Å and about 3,000 Å. The SOG thickness is between about 3,000 Å and about 4,000 Å. The PEOX (2) thickness is between about 5,000 Å and about 6,000 Å.

Figure 2K:
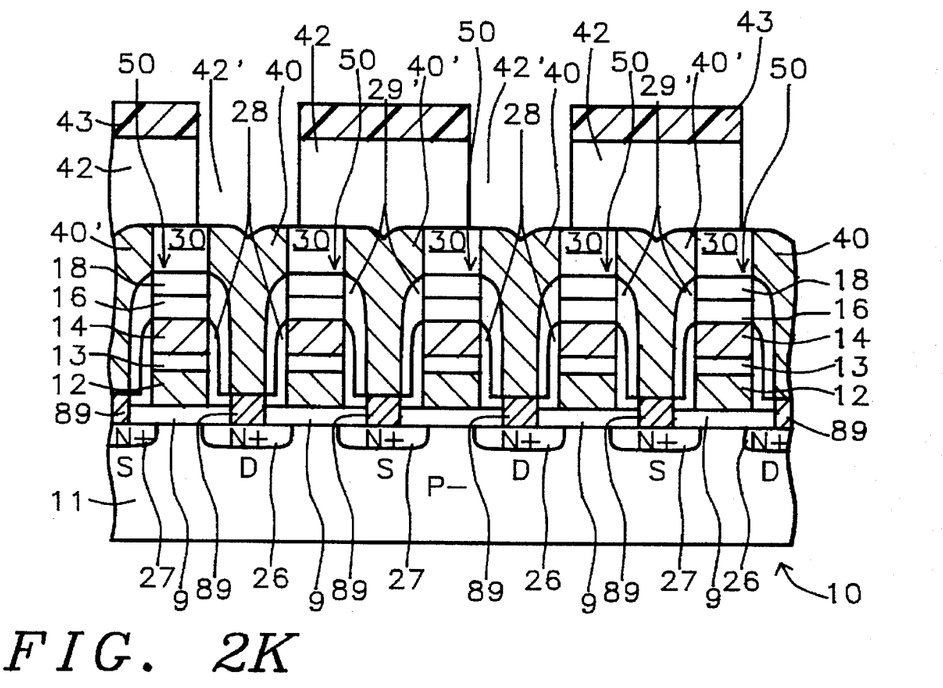
FIG. 2K shows the device of FIG. 2J after formation of a via mask with via openings therethrough has been formed over the IMD layer, and has been used to etch, through holes therein, via openings down through the IMD layer to the surface of drain plugs over drain regions, but not over source lines which overlie source regions.

FIG. 2K shows the device 10 of FIG. 2J after formation of a via mask 43 with via openings 43' therethrough formed over IMD layer 42, and has been used to etch, through holes 43' therein, via openings 42' down through IMD layer 42 to the surface of drain plugs 40 over drain regions 26, but not over source lines 40' which overlie source regions 27.

Figure 2L:
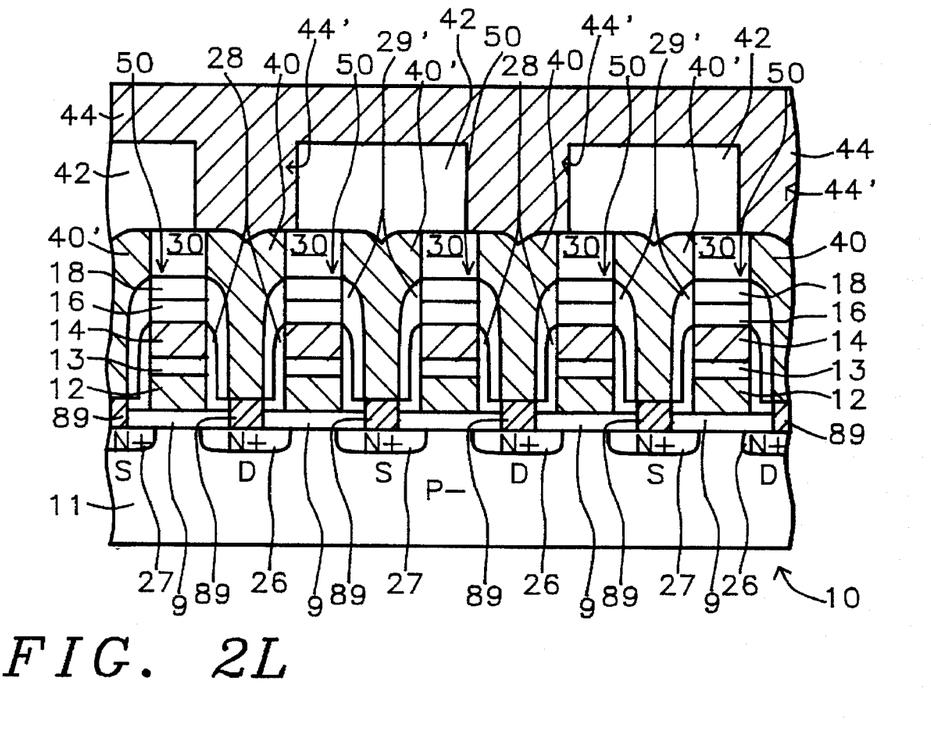
FIG. 2L is a sectional elevation view taken along line 2L—2L in FIG. 2M.
Figure 2M:
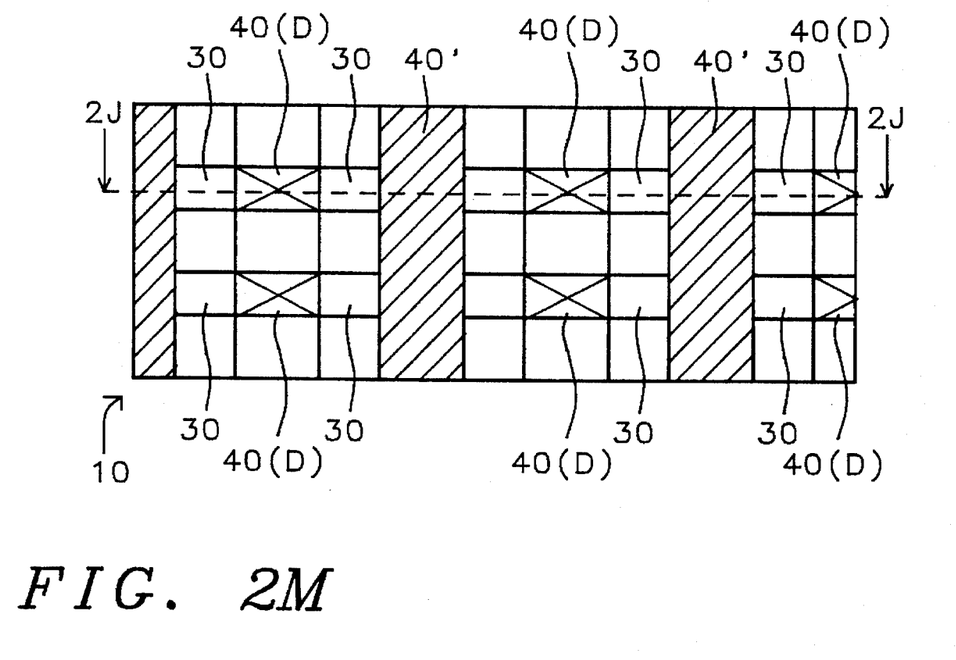
FIG. 2M is a sectional plan view taken along line 2M—2M in FIG. 2L.

FIG. 2L is a sectional elevation view of device 10 taken along line 2L—2L in FIG. 2M. FIG. 2L shows the flash memory device 10 of FIGS. 2K after the bit-line metal 44 has been formed over the device of FIG. 2K including the IMD layer 42 extending down into contact with drain plugs 40 through openings 42' in IMD layer 42 shown in FIG. 2K.

The bit-line 44 has been patterned by formation of a photoresist mask (not shown) formed over the metal bit-line material 44. Bit-line layer 44 is then etched to provide the metal bit-lines 44 in accordance with the two parallel bit-line patterns seen in FIG. 1B. Then the metal bit-line material is etched providing metal bit-lines 44. Metal bit-lines 44 are Ti/AlSiCu/TiN, about 8,000 Å thick.

FIG. 2M is a sectional plan view of the device 10 taken along line 2M—2M in FIG. 2L.

In FIG. 2M, the location of metal drain plugs 40 and the contacts with drain regions 26 below is indicated by X markings. The BPSG regions 30 are marked as the white areas. The metal bit-lines 44 which contact the drain plugs 40 bridge over the top surfaces of dielectric layer 42 as shown in FIG. 2L.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method for manufacturing integrated circuit memory devices which comprises the steps of:

provuding a semiconductor substrate having memory devices thereon to which electrical connections must be made, forming a tunnel oxide layer on said substrate, forming a blanket, doped, floating gate layer said tunnel oxide layer on said substrate, forming an intergate dielectric layer over said first, blanket, doped, floating gate layer, forming a blanket control gate electrode layer over said intergate dielectric layer, forming a silicon dioxide dielectric layer over said control gate electrode layer, forming a silicon nitride ($Si_3N_4$) layer over said silicon dioxide layer, forming a source/drain mask over said silicon nitride layer with source/drain openings therein, etching to form an array of stacks of said silicon nitride ($Si_3N_4$) layer, said silicon dioxide dielectric layer, control gate electrode layer, said intergate dielectric layer, and said floating gate layer down to said tunnel oxide layer, said stacks having sidewalls with trench spaces therebetween, ion implantation of source/drain dopant ions between said stacks forming alternating source regions and drain regions below said trench spaces between said sidewalls, forming spacer dielectric structures adjacent to said sidewalls, forming a blanket dielectric layer over said stacks, said trench spaces and said sidewalls, etching source line openings down to said source regions and etching drain plug openings down to said drain regions through said blanket dielectric layer down to said source regions and said drain regions, forming a conductive metal blanket layer over said device extending down into contact with said source regions through said source line openings and down into contact with said drain regions through said drain plug openings, etching back said conductive metal layer leaving drain plugs and source lines, said drain plugs being over said drain regions comprising conductive metal in said plug openings between said stacks and said source lines being over said source regions comprising conductive metal in said source line openings between said stacks and said spacers, depositing an intermetal dielectric layer over said device including said drain plugs and said source lines, forming a via mask with via openings over said drain plugs upon said intermetal dielectric layer, etching through said via openings in said via mask through said intermetal dielectric layer forming openings therethrough to said drain plugs, stripping said via mask, and depositing of metal over said intermetal dielectric layer into said via openings extending down into contact with said drain plugs, whereby said memory devices include metallic source lines and self-aligned contacts.

2. The method of claim 1 wherein said intermetal dielectric layer comprises a PEOX/SOG/PEOX dielectric.

3. The method of claim 1 wherein said intermetal dielectric layer comprises a PEOX/SOG/PEOX layer comprising a first PEOX layer with a thickness between about 2,000 Å and about 3,000 Å, a SOG layer with a thickness between about 3,000 Å and about 4,000 Å and a second PEOX layer with a thickness between about 5,000 Å and about 6,000 Å.

4. The method of claim 1 wherein said blanket dielectric layer comprises BPTEOS.

5. The method of claim 2 wherein said blanket dielectric layer comprises BPTEOS.

6. The method of claim 3 wherein said blanket dielectric layer comprises BPTEOS.

7. The method of claim 1 wherein said conductive metal comprises tungsten metal.

8. The method of claim 1 wherein said conductive source lines comprises tungsten metal extending between source regions from one flash memory device to the next flash memory device.

9. The method of claim 3 wherein said conductive metal comprises tungsten metal.

10. The method of claim 3 wherein said conductive source lines comprise tungsten metal extending between source regions from one one flash memory device to the next flash memory device.

11. The method of claim 5 including said silicon dioxide layer comprises a TEOS (tetraethylorthosilicate) dielectric layer formed at a temperature between about 650° and 750° C. in an LPCVD reactor by decomposing tetraethoxysilane, $Si(OC_2H_5)_4$ vaporized from a liquid source producing a complex mixture of organic and organosilicon compounds above said blanket control gate electrode layer.

12. The method of claim 6 including said silicon dioxide layer comprises a TEOS (tetraethylorthosilicate) dielectric layer formed at a temperature between about 650° and 750° C. in an LPCVD reactor by decomposing tetraethoxysilane, $Si(OC_2H_5)_4$ vaporized from a liquid source producing a complex mixture of organic and organosilicon compounds above said blanket control gate electrode layer.

13. The method of claim 1 including forming said source regions and said drain regions with an MDD ion implanting process.

14. The method of claim 2 including forming said source regions and said drain regions with an MDD ion implanting process.

15. The method of claim 4 including forming said source regions and said drain regions with an MDD ion implanting process.

16. The method of claim 4 including forming said source regions and said drain regions with an MDD ion implanting process.

17. The method of claim 9 including forming said source regions and said drain regions with an MDD ion implanting process.

18. The method of claim 10 including forming said source regions and said drain regions with an MDD ion implanting process.

19. The method of claim 11 including forming said source regions and said drain regions with an MDD ion implanting process.

20. A method for manufacturing integrated circuit memory devices which comprises the steps of:

providing a semiconductor substrate having a devices therein to which electrical connections must be made, forming a tunnel oxide layer on said substrate, forming a blanket, doped, polysilicon layer over said tunnel oxide layer on said substrate, forming an intergate dielectric layer over said polysilicon layer, forming a polycide layer over said intergate dielectric layer, forming a silicon dioxide dielectric layer over said polycide layer said silicon dioxide layer comprises a TEOS (tetraethylorthosilicate) dielectric layer at a temperature between about 650° and 750° C. in an LPCVD reactor by decomposing tetraethoxysilane, $Si(OC_2H_5)_4$ vaporized from a liquid source producing a complex mixture of organic and organosilicon compounds, forming a silicon nitride ($Si_3N_4$) layer over said silicon dioxide layer, forming a source/drain mask over said silicon nitride layer with source/drain openings therein, etching to form an array of stacks of said silicon nitride ($Si_3N_4$) layer, said silicon dioxide dielectric layer, polycide layer, said intergate dielectric layer, and said polysilicon layer down to said tunnel oxide layer, said stacks having sidewalls with trench spaces therebetween, ion implantation of source/drain dopant ions with an MDD ion implanting process between said stacks forming alternating source regions and drain regions below said trench spaces between said sidewalls, forming spacer dielectric structures adjacent to said sidewalls, forming a blanket dielectric layer over said stacks, said trench spaces and said sidewalls, said blanket dielectric layer comprising BPTEOS, etching source line openings down to said source regions and etching drain plug openings down to said drain regions through said blanket dielectric layer down to said source regions and said drain regions, forming a conductive metal blanket layer over said device extending down into contact with said source regions through said source line openings and down into contact with said drain regions through said drain plug openings, etching back said conductive metal layer leaving drain plugs and source lines, said drain plugs being over said drain regions comprising conductive metal in said plug openings between said stacks and said source lines being over said source regions comprising conductive metal in said source line openings between said stacks and said spacers, depositing an intermetal dielectric layer over said device including said drain plugs and said source lines, said intermetal dielectric layer comprising a PEOX/SOG/PEOX dielectric formed with a first PEOX layer with a thickness between about 2,000 Å and about 3,000 Å, a SOG layer with a thickness between about 3,000 Å and about 4,000 Å and a second PEOX layer with a thickness between about 5,000 Å and about 6,000 Å, forming a via mask with via openings over said drain plugs upon said intermetal dielectric layer, etching through said via openings in said via mask through said intermetal dielectric layer forming openings therethrough to said drain plugs, stripping said via mask, and depositing of metal over said intermetal dielectric layer into said via openings extending down into contact with said drain plugs, whereby said memory devices include metallic source lines and self-aligned contacts.

21. A method for manufacturing integrated circuit memory devices which comprises the steps of:

providing a semiconductor substrate having memory devices thereon to which electrical connections must be made, forming a tunnel oxide layer on said substrate, forming a blanket, doped, floating gate layer over said tunnel oxide layer on said substrate, forming an intergate dielectric layer over said first, blanket, doped, floating gate layer, forming a blanket control gate electrode layer over said intergate dielectric layer, forming at least a first dielectric layer over said control gate electrode layer, forming a source/drain mask over said dielectric layer with source/drain openings therein, etching to form an array of stacks of said dielectric layer, said control gate electrode layer, said intergate dielectric layer, and said floating gate layer down to said tunnel oxide layer, said stacks having sidewalls with trench spaces therebetween, ion implantation of source/drain dopant ions between said stacks forming alternating source regions and drain regions below said trench spaces between said sidewalls, forming spacer dielectric structures adjacent to said sidewalls, forming a blanket second dielectric layer over said stacks, said trench spaces and said sidewalls, etching source line openings down to said source regions and etching drain plug openings down to said drain regions through said blanket dielectric layer down to said source regions and said drain regions, forming a conductive metal blanket layer over said device extending down into contact with said source regions through said source line openings and down into contact with said drain regions through said drain plug openings, etching back said conductive metal layer leaving drain plugs and source lines, said drain plugs being over said drain regions comprising conductive metal in said plug openings between said stacks and said source lines being over said source regions comprising conductive metal in said source line openings between said stacks and said spacers, depositing an intermetal dielectric layer over said device including said drain plugs and said source lines, forming a via mask with via openings over said drain plugs upon said intermetal dielectric layer, etching through said via openings in said via mask through said intermetal dielectric layer forming openings therethrough to said drain plugs, stripping said via mask, and depositing of metal over said intermetal dielectric layer into said via openings extending down into contact with said drain plugs, whereby said memory devices include metallic source lines and self-aligned contacts.

* * * * *